(12) United States Patent
Petrovic

(10) Patent No.: US 9,473,096 B2
(45) Date of Patent: Oct. 18, 2016

(54) METHOD AND APPARATUS FOR ADAPTIVE TRANSMIT POWER CONTROL

(71) Applicant: Entropic Communications, LLC., Carlsbad, CA (US)

(72) Inventor: Branislav Petrovic, La Jolla, CA (US)

(73) Assignee: Entropic Communications, LLC, Carlsbad, CA (US)

( * ) Notice: Subject to any disclaimer, the term of this patent is extended or adjusted under 35 U.S.C. 154(b) by 58 days.

(21) Appl. No.: 14/290,553

(22) Filed: May 29, 2014

(65) Prior Publication Data

US 2015/0349838 A1 Dec. 3, 2015

(51) Int. Cl.
| | |
|---|---|
| *H04B 1/38* | (2015.01) |
| *H03G 3/20* | (2006.01) |
| *H04L 27/36* | (2006.01) |
| *H04B 17/14* | (2015.01) |
| *H04B 17/13* | (2015.01) |

(52) U.S. Cl.
CPC ............... *H03G 3/20* (2013.01); *H04B 17/14* (2015.01); *H04L 27/367* (2013.01); *H04B 17/13* (2015.01)

(58) Field of Classification Search
CPC ........ H04B 17/14; H04B 17/20; H04B 1/38; H04B 17/13; H04B 1/40; H04B 7/15585; H03F 2200/421; H03F 3/195; H03F 3/211; H03G 3/20; H04L 27/367
USPC ........................... 375/221; 455/73, 115.1, 78
See application file for complete search history.

(56) References Cited

U.S. PATENT DOCUMENTS

| | | | |
|---|---|---|---|
| 8,150,045 B2* | 4/2012 | Thuy et al. ................. 381/57 |
| 8,565,343 B1* | 10/2013 | Husted et al. ............. 375/297 |
| 2006/0046668 A1* | 3/2006 | Uratani et al. .......... 455/127.5 |
| 2009/0207896 A1* | 8/2009 | Behzad ................... 375/221 |
| 2014/0300418 A1* | 10/2014 | Chang ..................... 330/282 |

* cited by examiner

*Primary Examiner* — Leila Malek
(74) *Attorney, Agent, or Firm* — McAndrews Held & Malloy

(57) ABSTRACT

Systems and methods for dynamically adjusting transmit gain in a transceiver. The gain is adjusted in order to provide the maximum gain. The amount of distortion is measured. The gain is increased until the distortion reaches a predetermined limit. The gain of several components can be adjusted independently.

77 Claims, 5 Drawing Sheets

METHOD AND APPARATUS FOR ADAPTIVE TRANSMIT POWER CONTROL

TECHNICAL FIELD

The disclosed method and apparatus relate to radio frequency transmitters, and more particularly to methods and systems for controlling the power level of transmissions from a radio frequency transmitter.

BACKGROUND

Error free transmission of information is important in the communications industry today. In order to effectively transmit information modulated on radio frequency signals either over the air or on a medium such as a coaxial cable, it is helpful to properly set the power level at which modulated radio frequency signals are to be transmitted. The effective use of transmission power is the focus of much attention. Communications engineers are frequently concerned with is maximizing the amount of power used to transmit signals without causing distortion that will cause errors in the demodulation of data on the receiving side of the communications channel. Another concern is setting the desired amount of transmit power to the level necessary to ensure that the intended receivers receive the signals with sufficient power to accurately demodulate the information transmitted, but with no more power than is necessary. Accurately determining the amount of power that can be transmitted with an acceptable level of distortion allows the greatest transmit power range and the greatest data throughput.

In some systems, a closed loop power control system is used. Such closed loop power control systems require the receiver to provide feedback regarding the receiver's ability to accurately demodulate the information that is being transmitted. Such closed loop power control systems are relatively slow and require the receiver to demodulate the transmitted information before such feedback can be provided.

In addition to closed loop feedback control systems, transmitters are typically calibrated prior to being sent out to the field. The calibration is an attempt to determine the dynamic range of the transmitter and determine the particular output levels at which distortion will occur and to determine the amount of loss that the signal will incur prior to being transmitted.

FIG. 1 is a simplified block diagram of a transmission section 100 of a transmitter. The maximum power that a transmitter can transmit is typically determined at the time the circuit is designed. Once the circuit is manufactured, the circuit is tested to determine the characteristics of the particular components that comprise the transmission section 100. The transmission section 100 is connected to a test load that simulates the conditions under which the transmission section 100 will be operating when put to use in the field. The transmission section 100 is placed in calibration/test mode by the combination of a receive/transmit (R/T) switch 102 and a calibration switch 112. In calibration/test mode, the R/T switch 102 disconnects a power amplifier (PA) 104 from a filter 106. In addition, the calibration switch 112 is closed to connect the output of the PA 104 to the input of a detector 114. The output of the PA 104 is also connected to a nominal test load 116 having a resistance that is equal to the impedance of the medium into which the transmission is to be launched (e.g., 75 ohms). Therefore, when the switch 112 is closed, the amount of power output by the PA 104 is measured by the detector 114.

A test signal is injected into the PA 104. A measurement made by the detector 114 on the test signal is reported to a PA controller 118. The PA controller 118 adjusts the gain of the PA 104 until the signal level is at a target value. The target value is determined based upon an estimate of a set of factors. These factors include the errors that might be present in the detector 114, any uncertainty in the level at which the PA 104 will begin to compress/distort the signals being amplified and the amount of distortion and attenuation due to the output filter 106 and the impedance of the load (not shown) coupled to the output port 108. Once the proper gain is determined for the PA 104, the unit is ready to be used in the field.

Accounting for all of the uncertainties associated with factors noted above requires a relatively large safety margin. That is, the transmission section 100 may need to operate at 3 dB, or more, above what is determined by the test procedure to be at the point at which information delivered to the load can be accurately demodulated. Accordingly, the transmitter will deliver enough power to meet the desired target in the majority of cases, but with more power than might be appropriate for the average situation. This is done in order to ensure that the power settings will provide a reliable signal (acceptable receive power) in the majority of situations. Even transmitting with a safety margin of 3 dB (i.e., doubling the target level output power) may not be sufficient to ensure that the target level output power will actually be delivered in all cases. The margin must be selected such that when the unknown factors noted above are at their worst case values, every unit (or at least every unit minus a negligible number of outlier units) will be able to deliver a signal that has an acceptable power level without excessive distortion.

While the margin noted above is required in order to ensure proper operation in nearly all cases, transmitting with such a margin is not necessary in most cases. Transmitting with a margin that is greater than necessary in most cases means that the DC power is significantly higher than necessary in most cases (i.e., nearly double that required). Yet, the resulting operation may still be sub-optimal in outlying cases due to the uncertainties that exist from unit to unit and situation to situation. In order to optimize the power level of transmissions, extensive work is done in the laboratory to obtain statistics and determine the most efficient and effective margin possible. Even with such work, a compromise is required. That is, a balance must be struck between providing more power than is optimal in some cases under the assumption that the more power will be necessary than then is actually the case and transmitting with less power than is optimal in cases in which these factors require more power than is assumed.

In addition to the above situations, in systems that use a closed loop power control system, the path between a transmitter and one receiver may have more loss than the path to several other receivers. In this case, the transmitter will be driven to transmit more power than is required for the receivers communicating over the low loss paths. Transmitting at the higher power level can cause distortion in the transmitter that results in errors occurring in the information transmitted. Therefore, a relatively large number of receivers will suffer because of the needs of one receiver.

Accordingly, there is presently a need for a method and apparatus that can more efficiently and effectively determine the amount of power with which a transmitter should transmit signals to ensure that a target output power will be delivered with an acceptable level of distortion.

SUMMARY

Various embodiments of the disclosed method and apparatus for delivering a target output power are presented. Some of these embodiments are directed toward systems and methods for adaptively determining the amount of transmit power required to account for several factors. These factors include: (1) errors that might be present in a detector used to detect output power, (2) uncertainty in the level at which a power amplifier used in the system will begin to compress or distort the signals being amplified and (3) the amount of distortion and attenuation that is due to output filters and the impedance of the load coupled to the output port of the transmitter.

In accordance with one embodiment of the disclosed method and apparatus, output power from the transmission section of a transceiver is measured during actual transmission to a load, such as a live network. A loop-back path is provided between the output of a power amplifier (PA) and the input of a low noise amplifier (LNA). Accordingly, output power is provided from the PA to the receiver section of the transceiver. In one embodiment, a test signal is provided and transmitted into the actual load in the field during designated times set aside by the network manager. In another embodiment, the measurements are made during actual operation with live data (i.e. data intended to be received by a receiver).

The receiver section of the transceiver evaluates the transmission signal. In one embodiment, the evaluation includes measuring the transmit modulation error ratio (Tx-MER). Alternatively, compression of the peak power level measured to evaluate the transmission signal. A gain control module performs a procedure that starts at a relatively low power level and increases the power level in steps. After each incremental increase in the power, a measurement is made to ensure that there is an acceptable level of distortion to the output signal. Additional adjustments can be made to the input power applied to a digital to analog converter (DAC) that precedes the PA. That is, the digital input to the DAC can be adjusted to ensure that the input to the DAC is at the optimal level (i.e., that input of the PA is as high as possible with the distortion generated by the DAC maintained at an acceptable level). In addition, in one embodiment, a pre-amplifier (pre-amp) amplifies the output of the DAC prior to the signal being input to the PA. In one such embodiment, the gain of the pre-amp is also optimized.

In one embodiment, the peak amplitude is monitored. Both amplitude and phase compression in the peak amplitude are monitored and used as a metric of the amount of distortion present in the output signal. The amount of distortion is used to determine the proper amount of gain for each component of the transmission path.

BRIEF DESCRIPTION OF THE DRAWINGS

The disclosed method and apparatus, in accordance with one or more various embodiments, is described with reference to the following figures. The drawings are provided for purposes of illustration only and merely depict examples of some embodiments of the disclosed method and apparatus. These drawings are provided to facilitate the reader's understanding of the disclosed method and apparatus. They should not be considered to limit the breadth, scope, or applicability of the claimed invention. It should be noted that for clarity and ease of illustration these drawings are not necessarily made to scale.

The figures are not intended to be exhaustive or to limit the claimed invention to the precise form disclosed. It should be understood that the disclosed method and apparatus can be practiced with modification and alteration, and that the invention should be limited only by the claims and the equivalents thereof.

DETAILED DESCRIPTION

Figure 1:
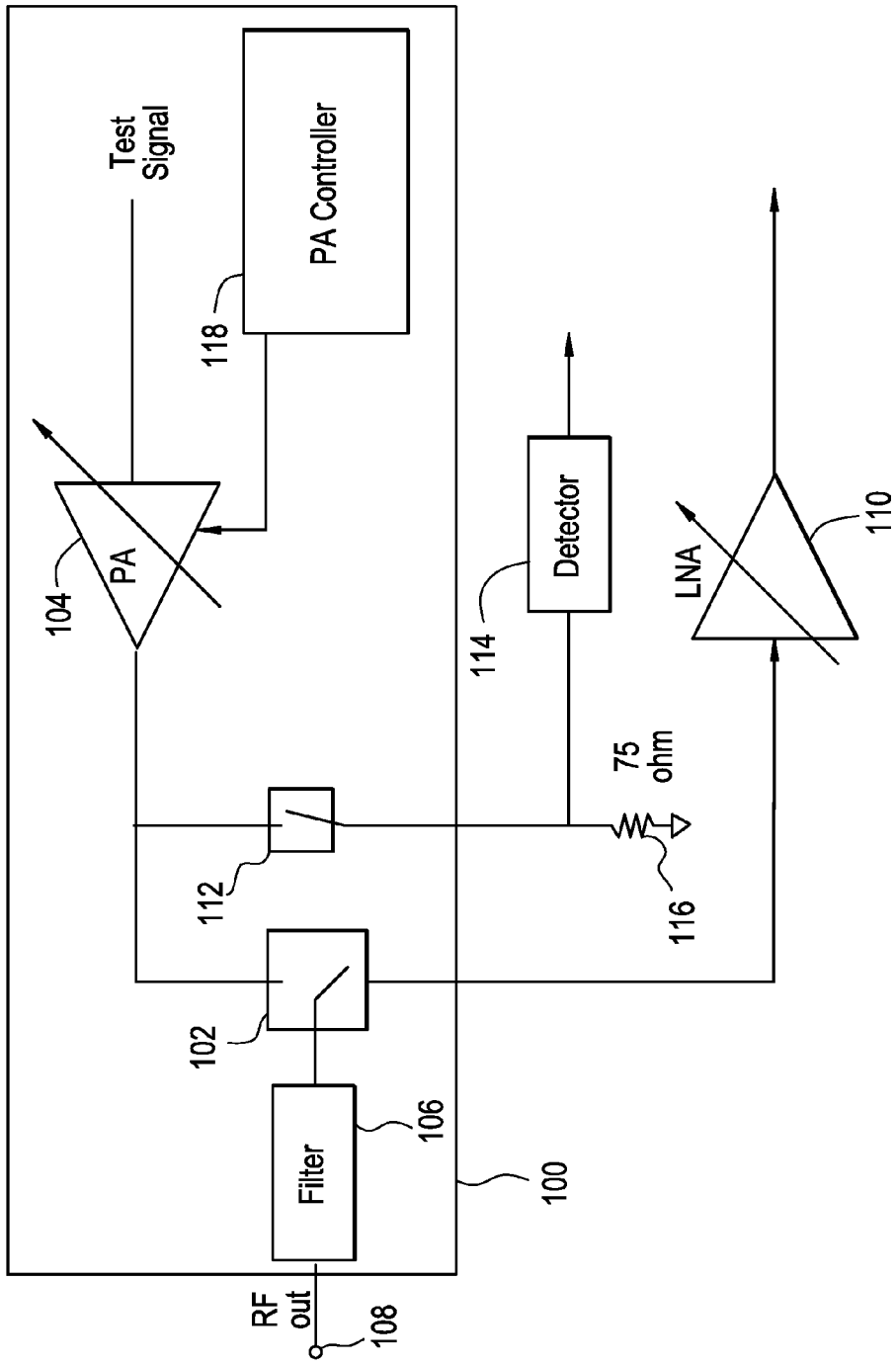
FIG. 1 is a simplified block diagram of prior art transceiver.
Figure 2:
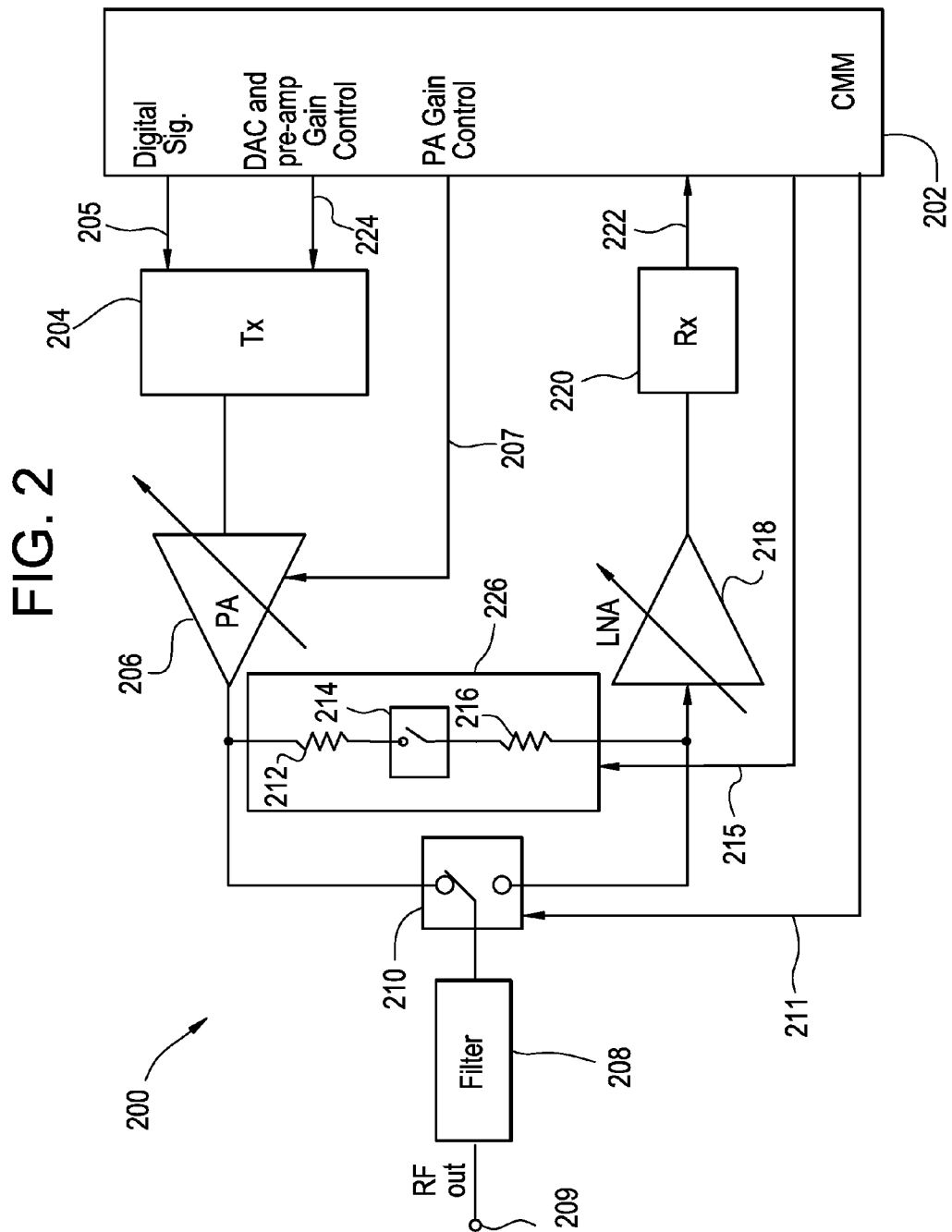
FIG. 2 is a simplified block diagram of a transceiver in accordance with one embodiment of the presently disclosed method and apparatus.

FIG. 2 is a simplified block diagram of a transceiver 200 in accordance with one embodiment of the presently disclosed method and apparatus. The transceiver 200 includes a Control and Measurement Module (CMM) 202. The CMM 202 is coupled to a transmission (Tx) block 204. The CMM 202 provides digital signals 205 that are to be transmitted to the Tx block 204. The amplitude of the digital signals 205 are adjustable by the CMM 202. In accordance with one embodiment of the disclosed method and apparatus, the digital signals 205 include test signals at selected times in order to measure the amount of distortion that exists in the transmitted signal. In an alternative embodiment, the amount of distortion present in the transmitted signals is measured directly with digital signals modulated with "live" data (i.e., data intended for a receiver to which the transceiver is transmitting). The Tx block 204 outputs an analog signal to a power amplifier (PA) 206. The CMM 202, the Tx block 204 and the PA 206 are part of a transmit chain. The PA 206 provides a variable amount of gain to the signal coupled to an output filter 208. The gain of the PA 206 is controlled by a PA gain control signal 207 coupled to the PA from the CMM 202. The PA 206 is coupled to the output filter 208 by a receive/transmit (R/T) switch 210. The R/T switch 210 is shown in the transmit position. In one embodiment of the presently disclosed method and apparatus, the R/T switch 210 is controlled by a switch control signal 211 from the CMM 202. Those skilled in the art will understand that the particular arrangement of components in the transmit chain may vary significantly. Nonetheless, in accordance with the disclosed method and apparatus, the gain of one or more components is controlled in order to set the transmit power level of the output. The particular example provided herein is merely one implementation a transmit chain of the disclosed method and apparatus.

In one embodiment of the disclosed method and apparatus, the output of the PA 206 is coupled to a loop-back path 226. In accordance with one embodiment, the loop-back path 226 includes a first isolation resistor 212, a test/calibration (T/C) switch 214, and a second isolation resistor 216. The first isolation resistor 212 shunts some of the output power to the T/C switch 214. In accordance with one embodiment of the disclosed method and apparatus, the T/C switch 214 is controlled by a switch control signal 215. The second isolation resistor 216 couples the output of the T/C switch 214 to the input of a low noise amplifier (LNA) 218 when the T/C switch 214 is closed. Thus, a loop-back signal is derived from looping back a portion of the output of the PA 206 and coupled to the input of the LNA 218.

The output of the LNA 218 is coupled to a receive block (Rx) 220. The Rx block 220 converts the analog output from the LNA 218 to a digital output signal 222. The digital output signal 222 from the Rx block 220 is coupled to an input to the CMM 202. Note that the input to the LNA 218 is disconnected from the filter 208 when the R/T switch 210 is in transmit position.

In an alternative embodiment, the R/T switch 210 leakage when operating in transmit mode forms the loop-back path. That is, there is sufficient leakage through the switch 210 when the switch 210 is in transmit position to allow sufficient power in the transmit signal to be coupled from the output of the PA 206 to the input of the LNA 218 to serve as a loop-back path and yet provide necessary isolation between the transmit and receive sections of the transceiver 200. Accordingly, in this embodiment, there is no need for the isolation resistors 212, 216 and the loop-back switch 214.

In accordance with one embodiment of the presently disclosed method and apparatus, the CMM 202 is a digital signal processor (DSP). Information to be transmitted is provided to the CMM 202. The CMM 202 will modulate the information and output that information to the Tx block 204 as a digital signal. In addition, in accordance with one embodiment of the disclosed method and apparatus, the CMM 202 outputs a digital to analog converter (DAC) and pre-amp gain control signal 224 to the Tx block 204.

Figure 3:
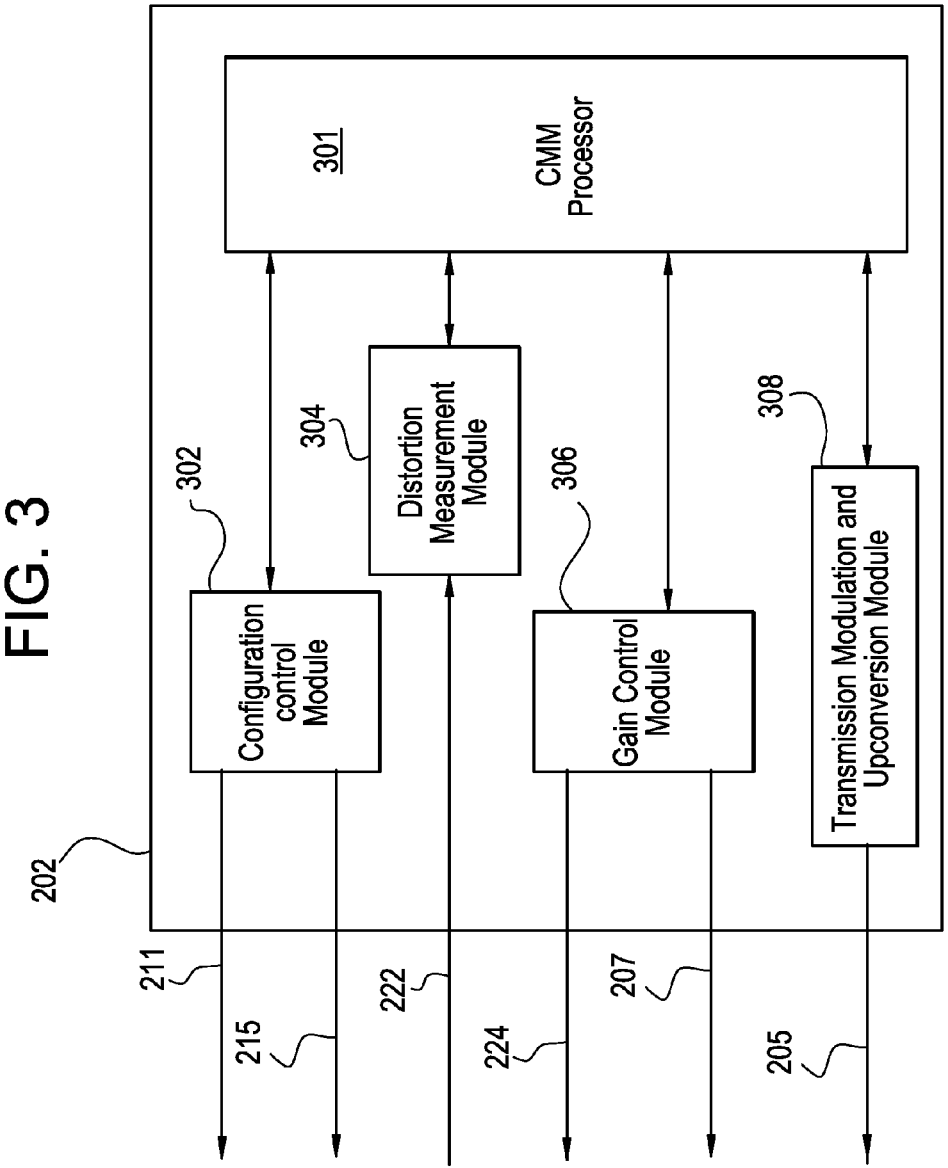
FIG. 3 is a simplified functional block diagram of a control and measurement module (CMM).

FIG. 3 is a simplified functional block diagram of the CMM 202. In accordance with one embodiment of the disclosed method and apparatus, the CMM 202 includes a CMM processor 301, a configuration control module 302, a distortion measurement module 304 a gain control module 306 and a transmission modulation and upconversion module 308. The configuration module 302 provides the switch control signals 211, 215 used to configure the switches 210, 214. In an alternative embodiment of the disclosed method and apparatus, the switches 210, 214 are controlled directly by the CMM processor 301.

The distortion measurement module 304 receives the digital output signal 222 from the Rx block 220. The distortion measurement module 304 analyzes the digital output signal 222 and determines whether the distortion present in the digital output signal 222 is above an acceptable distortion level. Alternatively, the digital output signal 222 is directly coupled to the CMM processor 301. The CMM processor 301 directly determines whether the amount of distortion present in the digital output signal 222 is above an acceptable distortion level.

In accordance with an alternative embodiment of the disclosed method and apparatus, the output signal 222 from the Rx block 220 is an analog signal. In one such embodiment, the analog signal is coupled directly to the CMM processor 301. The CMM processor 301 digitizes the output signal 222 from the Rx block 220 and determines whether the amount of distortion present in the output signal 222 is above an acceptable distortion limit.

The gain control module 306 controls the gain of transmit components, including the pre-amp 306 and the PA 206 based on input provided to the gain control module 306 from the CMM processor 301. In addition, the CMM processor 301 and/or the transmission modulation and upconversion module 308 constitute a transmission component by which the gain of the digital signal 205 can be adjusted. In accordance with one embodiment, the CMM processor 301 determines the amount of gain to be set in the PA 206 and pre-amp 306 based on the amount of distortion measured by the distortion measurement module 304. In an alternative embodiment of the disclosed method and apparatus, the gain control module 306 is directly coupled to the distortion measurement module 304. The CMM processor 301 also determines the amount of gain to applied to the digital signal 205 based on the amount of distortion measured by the distortion measurement module 304.

It will be clear to those skilled in the art that each of the modules within the CMM 202 may be implemented by a software module executed by a processor, such as a digital signal processor. Alternatively, one or more of the modules can be implemented using discrete hardware dedicated to the function disclosed for the particular module. In yet another alternative embodiment, one or more of the modules is implemented as a dedicated state machine. In yet another alternative embodiment, one or more of the modules is implemented as firmware executed by a processor or state machine. In yet another alternative embodiment, one or more of the modules within the CMM 202 are implemented as a combination of one or more of the following: software executed by a processor, firmware executed on a processor or state machine, discrete hardware, or a dedicated state machine.

Figure 4:
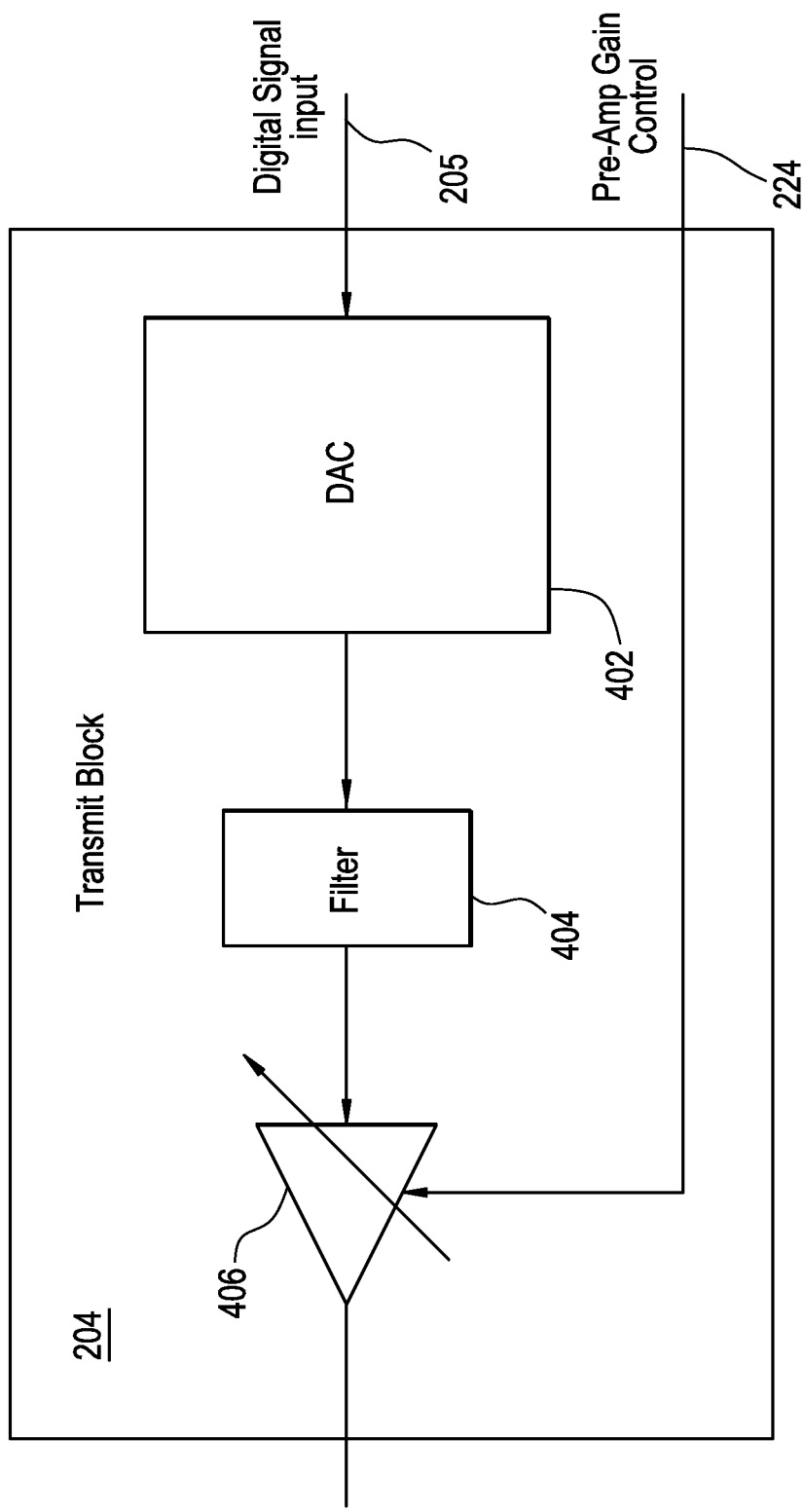
FIG. 4 is a simplified block diagram of the transmit block.

FIG. 4 is a simplified block diagram of the Tx block 204 in accordance with one embodiment of the presently disclosed method and apparatus. The Tx block 204 comprises a DAC 402, a filter 404 and a pre-amp 406. In one embodiment of the disclosed method and apparatus, the pre-amp 406 has variable gain. The gain control signal provided from the CMM 202 controls the gain of the pre-amp 406.

The digital signal output 205 from the CMM 202 to the Tx block 204 is converted to an analog signal by the DAC 402. The filter 404 reduces any out of band spurious signals that are generated by the DAC 402. The pre-amp 406 then amplifies the signals to be output to the PA 206. The DAC 402, the pre-amp 406, and the filter 404 all contribute to the noise that is generated by the Tx block 204. The noise is a function of the linearity of the components and the signal levels that are applied to each component of the Tx block 204. In accordance with one embodiment of the disclosed method and apparatus, the CMM 202 controls the input level to the DAC 402 and the amount of gain applied by the pre-amp 406 in order to maximize the output transmit power of the transceiver 200 while ensuring that there is no more than a predetermined maximum amount of distortion.

Figure 5:
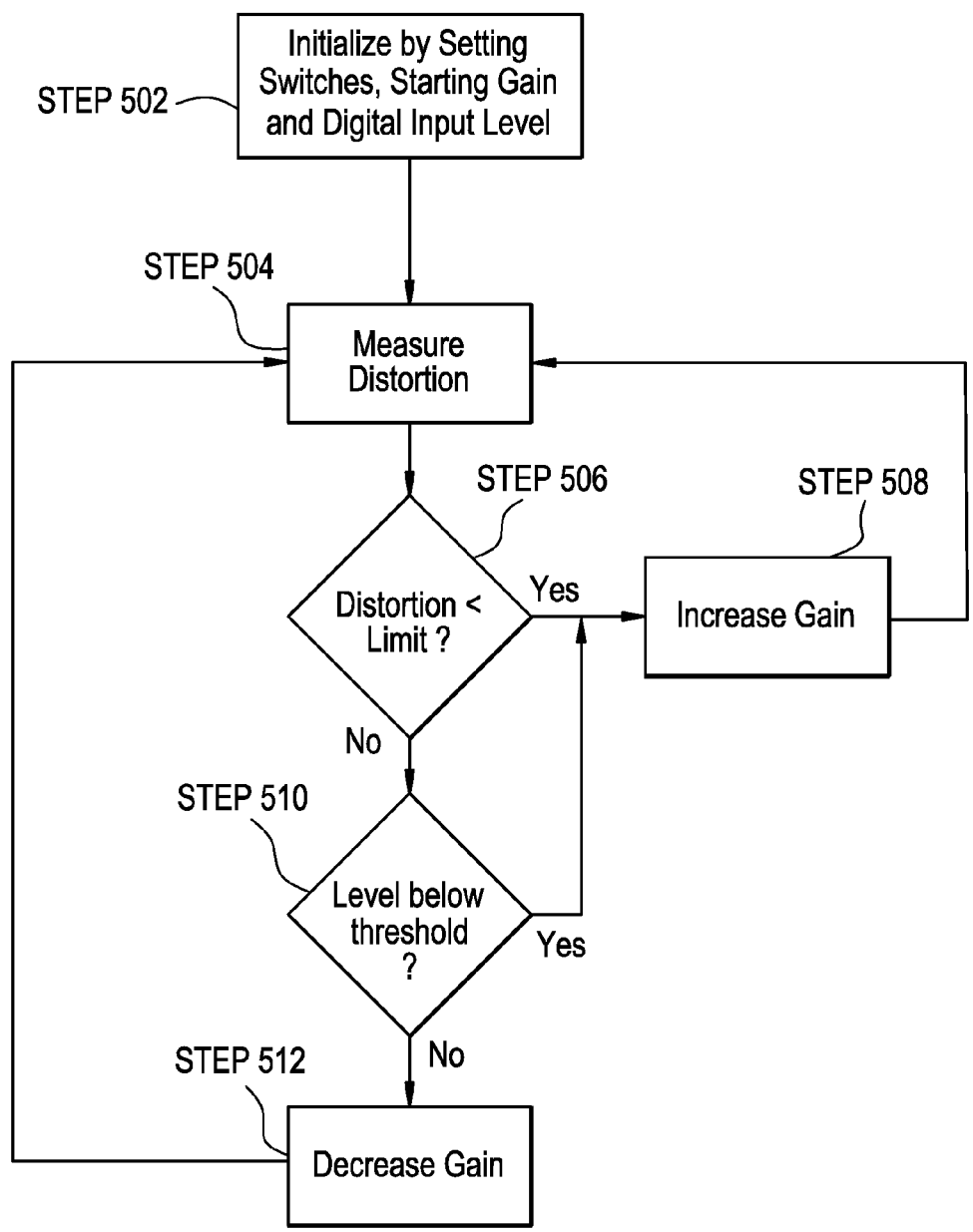
FIG. 5 is a flowchart of the method performed by the CMM to maximize the output of each component while ensuring that the amount of distortion to the output signal remains within a predetermined limit and accurately measure the output power provided to an actual load.

FIG. 5 is a flowchart of the method performed by the CMM 202 of the transceiver 200 to maximize the output of each component while ensuring that the amount of distortion to the output signal remains within a predetermined limit. In accordance with the example presented in FIGS. 2-4, the process shown in FIG. 5 will be implemented for the input to the DAC 402, the gain of the pre-amp 406 and the gain of the PA 206. Those skilled in the art will understand that this process can be implemented with respect to any component of the system for which the gain can be adjusted. In accordance with one embodiment of the disclosed method and apparatus, each of these will be adjusted independently. Alternatively, one or some combination of some of these components will be adjusted together. In yet another alternative embodiment, the gain of only one or some combination of less than all components are adjusted.

In accordance with one embodiment, the process is first implemented for the digital input level to the DAC 402. The system is initialized by setting the R/T switch 210 to the transmit position (see FIG. 2). The T/C switch 214 is closed. The input to the DAC 402, the gain of the pre-amp 406 and the PA 206 are each set to an initial setting that does not contribute to the distortion (STEP 502). Accordingly, the gain is initially set to a level that is in the center of the operating range of each component. It should be noted that if the signal levels of the inputs to and outputs from those components are essentially near the center of the operating range, they typically will contribute minimally to the distortion of the output signal. Accordingly, the signals are amplified to a level that is known to have an minimum amount of distortion.

In accordance with one embodiment of the disclosed method and apparatus, the fact that the amount of distortion is minimized can be verified during the process by adjusting the gain of the pre-amp 406 up slightly from the initial gain setting. A determination can then be made as to whether any additional distortion is added to the loop back signal as measured by the CMM 202. The gain of the pre-amp 406 can then be adjusted down slightly from the initial setting. The output can then be checked again to determine whether any additional distortion occurs to the loop back signal. It should be noted that the amount of distortion should remain essentially constant in that part of the operating range where minimum distortion occurs. A similar verification can be performed for the digital input level to the DAC 402 and for the gain of the PA 206.

In accordance with one embodiment, once the levels have been initialized, the CMM 202 will measure the amount of distortion that is present in the loop back signal output from the Rx block 220 to the CMM 202 (STEP 504). In accordance with one embodiment of the disclosed method and apparatus, the transceiver 200 is transmitting into an operational load, such as an active network (i.e., a network that has at least one active node communicating on the network) when the measurement is taken. If the distortion is less than a predetermined limit (STEP 506), then the level of the digital signal input to the DAC 402 is increased (STEP 508). In accordance with one embodiment, it can be assumed that when initially set essentially to the center of the operating range, the minimum amount of distortion will be introduced by each component of the transceiver 200 (i.e., the signal will be amplified to a signal level that is known to be acceptable). Therefore, level of the digital signal input to the DAC 402 is increased (STEP 508). The CMM 202 then makes another measurement of the amount of distortion in the loop back signal (STEP 504). This will continue through the STEPs 504 through 508 until the amount of distortion in the loop back signal is greater than the predetermined limit (STEP 506). Once the distortion is greater than the predetermined limit (STEP 506), a determination is made as to whether the signal level is below a predetermined threshold (STEP 510). This determination will ensure that the reason that the distortion is greater than the limit is because the gain being adjusted is too high. That is, the distortion could be greater than the predetermined limit if the signal level is set too low. Checking that the level is not below a predetermined threshold ensures this is not the case. Therefore, if the level of the signal that is being analyzed by the CMM 202 is not below the predetermined threshold, then the level of the digital input is decreased (STEP 512). After decreasing the level of the digital input, the process returns to STEP 504.

This process is then repeated for the gain of the pre-amp 406 and the gain of the PA 206.

TxMER is the amount of power that is provided by the signal at the intended quadrature amplitude modulation constellation point with respect to the amount of power at points other than the intended constellation point (i.e., the amount of power due to distortion of the modulated signal). In accordance with one embodiment of the disclosed method and apparatus, TxMER is used to measure the amount of distortion that is present in the signal.

In an alternative embodiment, distortion is measured based on the peak amplitude of the signal. Alternatively, the amount of distortion is measured based on the peak to average ratio of the signal received in the CMM 202. Determining the amount of distortion based on the peak amplitude or the peak to average ratio has the advantage of not requiring demodulation of the signal. In contrast, measuring TxMER requires demodulation. Therefore, measurements of distortion based on the peak amplitude or the peak to average ratio can be made much faster than measurements based on TxMER.

In accordance with one embodiment, both amplitude compression and phase compression of the peak amplitude can be measured. Phase compression occurs due to phase shifts as a consequence of non-linearities that occur as the signal levels rise. Similarly, amplitude compression occurs when an increase in the amplitude at the input of the component is not linear with respect to the resulting increase in the amplitude at the output of the component. Both amplitude compression and phase compression are measured by the CMM 202 and used as a measure of the amount of distortion when implementing the process shown in FIG. 5.

In accordance with one embodiment, a test tone having three coherent frequencies is used to adjust the gain of the components (e.g., the PA 206, the pre-amplifier 406 and the DAC 402). In one embodiment, the three frequencies are each carrier frequencies of an orthogonal frequency division multiplexed (OFDM) signal upon which test data is modulated. The CMM 202 outputs the test tone to be applied to the Tx block 204. The process of FIG. 5 is implemented and the gain of each of the components is adjusted. The peak amplitude can be measured at the point at which each of the frequencies is concurrently at 0 degrees in phase (i.e., when each is at peak amplitude). Any distortion that will occur will be maximum at that point. If either phase or amplitude compression is occurring, then the non-linear response can be detected by measuring the output while the amplitude of the input is increased (or decreased). This non-linear response will be indicative of distortion caused by overdriving one of the components. In one embodiment, several measurements of the distortion are made and averaged to improve the accuracy of individual measurements.

Since the PA 206 is connected to the operational load during the adjustment of the gain of each of the transmit components, the actual operational conditions are taken into account in making the gain adjustments. That is, in systems in which the output of the PA 206 is coupled to a load other than the actual operational load, the amount of distortion can change significantly from that which occurs under actual conditions. Furthermore, in many systems the particular nature of the load will vary significantly from one operational setting to another. That is, in the case in which the transceiver is a set top box communicating over a home entertainment network, such as a network operating in accordance with the well-known MoCA (Multimedia over Coax Alliance) standard, the load conditions of one home will be significantly different from the load conditions of another home. Therefore, adjustments made without taking the particular load conditions into account will require a relatively large margin. That is, in many situations, the gain will be set significantly higher than optimal, since the particular conditions of some homes into which the device is installed will be better than the average assumed when setting the gain. Even more to the point, the gain cannot even be set with an assumption of "average load conditions", since a significant percentage of homes will have conditions that are substantially worse than average. Using the actual output load that is used during normal operation when making gain adjustments ensures that the gain is accurately set for actual operational conditions. This is the case whether the input signal is a test tone or an actual signal to be transmitted. In one embodiment, gain adjustments are made on a continual basis with actual data being transmitted. Alternatively, the gain adjustments are made during designated transmission test slots (i.e., slots when test tones can be transmitted without interfering with the operation of the network into which the test tones are being transmitted). Nonetheless, the load on the transceiver 200 will be the actual operating load.

In addition to adjusting the gain under actual load conditions, the gain can be adjusted to account for changes in the operating conditions, including changes in temperature, the number of nodes on the network, changes in the power supply, etc. By adjusting the load under actual conditions, difficult statistical analysis that is currently used to determine the optimum operating gain for transmission, can be eliminated. That is, determining the amount of gain to be applied by each component requires several complex models to be created to determine what the worst case load will look like and at what point to compromise between higher output power and greater distortion under load conditions that, while unlikely to occur frequently, are certain to occur from time to time. That is, a compromise will always need to be made between having a limited number of installations encounter output power levels that are insufficient to allow accurate demodulation by all receivers and setting the gain of the transmitters too high in order to ensure that there is sufficient power to allow receivers to demodulate data accurately under bad conditions.

In one embodiment, the transmit signal can be intentionally pre-distorted (e.g., by adding third order, complex phase and amplitude corrections) to compensate for distortion that will occur through the transmission components. In one embodiment, a filter with adaptive tap weights using a least mean squares (LMS) algorithm can assist in mitigating distortion at higher output levels to extend the range of the transmission components.

The isolation resistors 212, 216 provide isolation that reduces the loading of the PA 206 when the T/C switch 214 is closed. Alternatively, the T/C switch is eliminated. The PA 206 output is coupled directly through the isolation resistors 212, 216 to the LNA. The resistors 212, 216 reduce the loading on the PA 206 and direct as much energy as possible to the load connected to the RF output 209. In yet another embodiment, the leakage through the R/T switch 210 provides sufficient signal to the input of the LNA 218 that no other path from the output of the PA 206 to the LNA 218 is required.

Although the disclosed method and apparatus is described above in terms of various examples of embodiments and implementations, it should be understood that the particular features, aspects and functionality described in one or more of the individual embodiments are not limited in their applicability to the particular embodiment with which they are described. For example, while peak amplitude level, peak to average ratio and TxMER are disclosed as convenient measures of distortion, it will be clear to those skilled in the art that other measures of distortion can be used to assist in the adjustment of the gain of the transmit components.

Furthermore, the particular number, type and combination of transmission components for which gain is adjusted and the order in which the gain is adjusted can vary in alternative embodiments of the disclosed method and apparatus.

Still further, while the CMM 202 is disclosed as measuring the distortion and controlling the gain, these functions can be performed by discrete components, a dedicated digital signal processor, a state machine or other circuitry that is designed to perform the functions disclosed above.

Further yet, the particular nature of the test signal used to drive the transmission components during gain adjustment can vary. It will be understood by those of ordinary skill in the art that the test signal can be one of a very large number of types of signals, as long as the amount of distortion in the signal can be detected by the receiver section of the transceiver 200.

In yet another alternative embodiment, a separate loop-back receiver can be provided that is dedicated to receiving the looped back signal and measuring the distortion.

Thus, the breadth and scope of the claimed invention should not be limited by any of the examples provided in describing the above disclosed embodiments.

Terms and phrases used in this document, and variations thereof, unless otherwise expressly stated, should be construed as open ended as opposed to limiting. As examples of the foregoing: the term "including" should be read as meaning "including, without limitation" or the like; the term "example" is used to provide examples of instances of the item in discussion, not an exhaustive or limiting list thereof; the terms "a" or "an" should be read as meaning "at least one," "one or more" or the like; and adjectives such as "conventional," "traditional," "normal," "standard," "known" and terms of similar meaning should not be construed as limiting the item described to a given time period or to an item available as of a given time, but instead should be read to encompass conventional, traditional, normal, or standard technologies that may be available or known now or at any time in the future. Likewise, where this document refers to technologies that would be apparent or known to one of ordinary skill in the art, such technologies encompass those apparent or known to the skilled artisan now or at any time in the future.

A group of items linked with the conjunction "and" should not be read as requiring that each and every one of those items be present in the grouping, but rather should be read as "and/or" unless expressly stated otherwise. Similarly, a group of items linked with the conjunction "or" should not be read as requiring mutual exclusivity among that group, but rather should also be read as "and/or" unless expressly stated otherwise. Furthermore, although items, elements or components of the disclosed method and apparatus may be described or claimed in the singular, the plural is contemplated to be within the scope thereof unless limitation to the singular is explicitly stated.

The presence of broadening words and phrases such as "one or more," "at least," "but not limited to" or other like phrases in some instances shall not be read to mean that the narrower case is intended or required in instances where such broadening phrases may be absent. The use of the term "module" does not imply that the components or functionality described or claimed as part of the module are all configured in a common package. Indeed, any or all of the various components of a module, whether control logic or other components, can be combined in a single package or separately maintained and can further be distributed in multiple groupings or packages or across multiple locations.

Additionally, the various embodiments set forth herein are described with the aid of block diagrams, flow charts and other illustrations. As will become apparent to one of ordinary skill in the art after reading this document, the illustrated embodiments and their various alternatives can be implemented without confinement to the illustrated examples. For example, block diagrams and their accompanying description should not be construed as mandating a particular architecture or configuration.

What is claimed is:

1. A transceiver comprising:
    a variable gain power amplifier (PA), the PA configured to receive a signal to be transmitted, and provide gain to the signal to be transmitted;
    a loop-back circuit comprising:
        a first terminal and a second terminal, the first terminal coupled to an output of the PA;
        a first resistor having a first and second terminal, the first terminal of the first resistor coupled to the output of the PA;
        a loop-back switch having a first and second terminal, the second terminal of the first resistor coupled the first terminal of the loop-back switch; and
        a second resistor having a first and second terminal, the first terminal of the second resistor coupled to the second terminal of the loop-back switch and the second terminal of the second resistor coupled to an input to a low noise amplifier (LNA); and
    a control and measurement module that is:
        coupled to the PA and to an output of the loop-back circuit; and
        configured to:
            provide the signal to be transmitted to the PA;
            measure whether distortion to the signal coupled from the output of the loop-back circuit is above an acceptable limit;
            if the amount of distortion is below the acceptable limit, provide a signal to the PA to increase the gain provided by the PA; and
            if the amount of distortion is above the acceptable limit, reduce the gain provided by the PA.

2. The transceiver of claim 1 further comprising:
    a) a transmit block, wherein signals coupled from the control and monitor measurement module to an input of the PA are coupled through the transmit block; and
    b) the LNA wherein signals coupled between the second terminal of the loop-back circuit and the control and measurement module are coupled through the LNA.

3. The transceiver of claim 2, further comprising a receive block, wherein signals coupled between the LNA and the control and measurement module are coupled through the receive block.

4. The transceiver of claim 3, wherein:
    the receive block includes a digital to analog converter (DAC);
    the control and measurement module is configured to:
        control the gain of digital inputs to the DAC;
        set the gain of the digital inputs to the DAC independent of the PA based on the determination of whether the distortion to the signal coupled from the output of the loop-back circuit is above the acceptable limit, wherein:
            if the distortion to the signal coupled from the output of the loop-back circuit is above the acceptable limit, gain of the digital inputs to the DAC is decreased; and
            if the distortion to the signal coupled from the output of the loop-back circuit is below the acceptable limit, gain of the digital signal is increased.

5. The transceiver of claim 2, further comprising a transmit/receive (T/R) switch having a first input/output (I/O) terminal, a second I/O terminal and a common terminal, the first I/O terminal coupled to the output of the PA, the second I/O terminal coupled to an input of the LNA and the common terminal switchable to make connection with either the first I/O terminal or the second I/O terminal and wherein the loop-back circuit is formed by the leakage from the first I/O terminal to the second I/O terminal between the output of the PA and the input of the LNA.

6. The transceiver of claim 2, wherein:
    the transmit block includes a pre-amplifier;
    the control and measurement module is configured to:
        set gain of the pre-amplifier independent of the PA based on the determination of whether the distortion to the signal coupled from the output of the loop-back circuit is above the acceptable limit, wherein:
            if the distortion to the signal coupled from the output of the loop-back circuit is above the acceptable limit, gain provided by the pre-amplifier is increased; and
            if the distortion to the signal coupled from the output of the loop-back circuit is below the acceptable limit, gain provided by the pre-amplifier is decreased.

7. The transceiver of claim 1, wherein the output of the PA is coupled to an operational load.

8. The transceiver of claim 7, wherein the operational load is an active network.

9. The transceiver of claim 7, wherein the control and measurement module is configured to provide a test signal to the PA to be transmitted during times at which transmission of test signals will not interfere with operations of the network.

10. The transceiver of claim 7, wherein the control and measurement module is configured to: (i) receive information intended to be transmitted to a receiver over the network; (ii) modulate the information; and (iii) couple the modulated information to the PA.

11. The transceiver of claim 1, wherein the distortion measurement comprises a measurement of the amount of amplitude compression in the peak amplitude of a loop-back signal.

12. A method for adjusting the gain of a transmitter, the method comprising:
    amplifying a transmit signal with an adjustable gain power amplifier (PA);
    measuring the amount of distortion in a loop-back signal while transmitting the amplified transmit signal to an operational load, wherein:
        the loop-back signal is derived from the transmit signal; and
        the loop-back signal is coupled from the output of the PA to the input of a low noise amplifier (LNA) by a loop-back circuit;

the output of the LNA is coupled to a distortion measurement module that is configured to determine whether the distortion in the loop-back signal is less than a limit;

if the amount of distortion that is measured is less than the limit, increasing the gain of the PA, otherwise decreasing the gain of the PA; and deriving the loop-back signal from leakage of a transmit/receive switch in transmit position.

13. The method of claim 12, further including performing the amplifying, the measuring, and the increasing for each component of a transmit chain of the transmitter for which gain of the component can be adjusted.

14. The method of claim 12, further including transmitting the transmit signal to an operational load while measuring distortion on the loop-back signal.

15. The method of claim 12, wherein the transmit signal is initially amplified to a level that is known to have an acceptable amount of distortion.

16. The method of claim 12, wherein the distortion measurement is made based on measurements of a peak amplitude of the loop-back signal.

17. The method of claim 12, wherein the distortion measurement is made based on measurements of a peak to average ratio of the loop-back signal.

18. The method of claim 12, wherein the distortion measurement is made based on amplitude compression in the peak amplitude of the loop-back signal.

19. The method of claim 12, wherein the distortion measurement is made based on both phase compression and amplitude compression in the peak amplitude of the loop-back signal.

20. The method of claim 12, wherein the distortion measurement is made based on transmit modulation error rate (MER) for the loop-back signal.

21. The method of claim 19, wherein the transmit signal is a test tone.

22. The method of claim 21, wherein the test tone is an orthogonal frequency division multiplexed (OFDM) signal comprising a plurality of carriers upon which test data is modulated.

23. The method of claim 19, wherein live transmit signals modulated with information intended for reception by a receiver.

24. A transceiver comprising:
a variable gain power amplifier (PA), the PA configured to receive a signal to be transmitted, and provide gain to the signal to be transmitted;
a loop-back circuit having a first terminal and a second terminal, the first terminal coupled to an output of the PA;
a control and measurement module that is:
coupled to the PA and to an output of the loop-back circuit; and
configured to:
provide the signal to be transmitted to the PA;
measure whether distortion to the signal coupled from the output of the loop-back circuit is above an acceptable limit;
if the amount of distortion is below the acceptable limit, provide a signal to the PA to increase the gain provided by the PA; and
if the amount of distortion is above the acceptable limit, reduce the gain provided by the PA;
a transmit block, wherein signals coupled from the control and monitor measurement module to an input of the PA are coupled through the transmit block;
a low noise amplifier (LNA) wherein signals coupled between the second terminal of the loop-back circuit and the control and measurement module are coupled through the LNA; and
a transmit/receive (T/R) switch having a first input/output (I/O) terminal, a second I/O terminal and a common terminal, the first I/O terminal coupled to the output of the PA, the second I/O terminal coupled to an input of the LNA and the common terminal switchable to make connection with either the first I/O terminal or the second I/O terminal and wherein the loop-back circuit is formed by the leakage from the first I/O terminal to the second I/O terminal between the output of the PA and the input of the LNA.

25. The transceiver of claim 24, further comprising a receive block, wherein signals coupled between the LNA and the control and measurement module are coupled through the receive block.

26. The transceiver of claim 25, wherein:
the receive block includes a digital to analog converter (DAC);
the control and measurement module is configured to:
control the gain of digital inputs to the DAC;
set the gain of the digital inputs to the DAC independent of the PA based on a determination of whether the distortion to the signal coupled from the output of the loop-back circuit is above an acceptable limit, wherein:
if the distortion to the signal coupled from the output of the loop-back circuit is above the acceptable limit, gain of the digital inputs to the DAC is decreased; and
if the distortion to the signal coupled from the output of the loop-back circuit is below the acceptable limit, gain of the digital inputs to the DAC is increased.

27. The transceiver of claim 24, wherein the output of the PA is coupled to an operational load.

28. The transceiver of claim 27, wherein the operational load is an active network.

29. The transceiver of claim 27, wherein the control and measurement module is configured to provide a test signal to the PA to be transmitted during times at which transmission of test signals will not interfere with operations of the network.

30. The transceiver of claim 27, wherein the control and measurement module is configured to: (i) receive information intended to be transmitted to a receiver over the network; (ii) modulate the information; and (iii) couple the modulated information to the PA.

31. The transceiver of claim 24, wherein distortion measurement comprises a measurement of the amount of amplitude compression in the peak amplitude of a loop-back signal.

32. The transceiver of claim 24, wherein:
the transmit block includes a pre-amplifier;
the control and measurement module is configured to:
set gain of the pre-amplifier independent of the PA by a determination of whether the distortion to the signal coupled from the output of the loop-back circuit is above an acceptable limit;
if the distortion to the signal coupled from the output of the loop-back circuit is above the acceptable limit, provide a signal to the pre-amplifier to increase the gain provided by the pre-amplifier; and if the distortion to the signal coupled from the output of the loop-back circuit is below the acceptable limit, reduce the gain provided by the pre-amplifier.

33. The transceiver of claim 32, wherein the distortion measurement is made based on measurements of a peak amplitude of a loop-back signal.

34. The transceiver of claim 32, wherein the distortion measurement is made based on measurements of a peak to average ratio of a loop-back signal.

35. The transceiver of claim 32, wherein the distortion measurement is made based on amplitude compression in the peak amplitude of a loop-back signal.

36. The transceiver of claim 32, wherein the distortion measurement is made based on both phase compression and amplitude compression in the peak amplitude of a loop-back signal.

37. The transceiver of claim 36, wherein the signal to be transmitted is a test tone.

38. The transceiver of claim 37, wherein the test tone is an orthogonal frequency division multiplexed (OFDM) signal comprising a plurality of carriers upon which test data is modulated.

39. The transceiver of claim 36, wherein the signal to be transmitted is a live transmit signal modulated with information intended for reception by a receiver.

40. The transceiver of claim 32, wherein the distortion measurement is made based on transmit modulation error rate (MER) for a loop-back signal.

41. A transceiver comprising:
a variable gain power amplifier (PA), the PA configured to receive a signal to be transmitted, and provide gain to the signal to be transmitted;
a loop-back circuit having a first terminal and a second terminal, the first terminal coupled to an output of the PA;
a control and measurement module that is:
coupled to the PA and to an output of the loop-back circuit; and
configured to:
provide the signal to be transmitted to the PA;
measure whether distortion to the signal coupled from the output of the loop-back circuit is above an acceptable limit, wherein distortion is measured by measuring the amount of amplitude compression in the peak amplitude of a loop-back signal;
if the amount of distortion is below the acceptable limit, provide a signal to the PA to increase the gain provided by the PA; and
if the amount of distortion is above the acceptable limit, reduce the gain provided by the PA.

42. The transceiver of claim 41 further comprising:
a transmit block, wherein signals coupled from the control and monitor measurement module to an input of the PA are coupled through the transmit block;
a low noise amplifier (LNA) wherein signals coupled between the second terminal of the loop-back circuit and the control and measurement module are coupled through the LNA.

43. The transceiver of claim 42, further comprising a receive block, wherein signals coupled between the LNA and the control and measurement module are coupled through the receive block.

44. The transceiver of claim 43, wherein:
the receive block includes a digital to analog converter (DAC);
the control and measurement module is configured to:
control the gain of digital inputs to the DAC; and
set the gain of the digital inputs to the DAC independent of the PA based on a determination of whether the distortion to the signal coupled from the output of the loop-back circuit is above an acceptable limit, wherein:
if the distortion to the signal coupled from the output of the loop-back circuit is above the acceptable limit, gain of the digital inputs to the DAC is decreased; and
if the distortion to the signal coupled from the output of the loop-back circuit is below the acceptable limit, gain of the digital inputs to the DAC is increased.

45. The transceiver of claim 42, wherein:
the transmit block includes a pre-amplifier; and
the control and measurement module is configured to:
set gain of the pre-amplifier independent of the PA by a determination of whether the distortion to the signal coupled from the output of the loop-back circuit is above an acceptable limit;
if the distortion to the signal coupled from the output of the loop-back circuit is above the acceptable limit, provide a signal to the pre-amplifier to increase the gain provided by the pre-amplifier; and
if the distortion to the signal coupled from the output of the loop-back circuit is below the acceptable limit, reduce the gain provided by the pre-amplifier.

46. The transceiver of claim 45, wherein the distortion measurement is made based on measurements of a peak amplitude of the loop-back signal.

47. The transceiver of claim 45, wherein the distortion measurement is made based on measurements of a peak to average ratio of the loop-back signal.

48. The transceiver of claim 45, wherein the distortion measurement is made based on amplitude compression in the peak amplitude of the loop-back signal.

49. The transceiver of claim 45, wherein the distortion measurement is made based on both phase compression and amplitude compression in the peak amplitude of the loop-back signal.

50. The transceiver of claim 49, wherein the signal to be transmitted is a test tone.

51. The transceiver of claim 50, wherein the test tone is an orthogonal frequency division multiplexed (OFDM) signal comprising a plurality of carriers upon which test data is modulated.

52. The transceiver of claim 49, wherein the signal to be transmitted is a live transmit signal modulated with information intended for reception by a receiver.

53. The transceiver of claim 45, wherein the distortion measurement is made based on transmit modulation error rate (MER) for the loop-back signal.

54. The transceiver of claim 41, wherein the output of the PA is coupled to an operational load.

55. The transceiver of claim 46, wherein an operational load is an active network.

56. The transceiver of claim 46, wherein the control and measurement module is configured to provide a test signal to the PA to be transmitted during times at which transmission of test signals will not interfere with operations of the network.

57. The transceiver of claim 46, wherein the control and measurement module is configured to: (i) receive information intended to be transmitted to a receiver over the network; (ii) modulate the information; and (iii) couple the modulated information to the PA.

58. A transceiver comprising:
a variable gain power amplifier (PA), the PA configured to receive a signal to be transmitted, and provide gain to the signal to be transmitted;
a loop-back circuit having a first terminal and a second terminal, the first terminal coupled to an output of the PA;
a control and measurement module that is:
  coupled to the PA and to an output of the loop-back circuit; and
  configured to:
    provide the signal to be transmitted to the PA;
    measure whether distortion to the signal coupled from the output of the loop-back circuit is above an acceptable limit;
    if the amount of distortion is below the acceptable limit, provide a signal to the PA to increase the gain provided by the PA; and
    if the amount of distortion is above the acceptable limit, reduce the gain provided by the PA;
a transmit block, wherein signals coupled from the control and monitor measurement module to an input of the PA are coupled through the transmit block; and
a low noise amplifier (LNA) wherein signals coupled between the second terminal of the loop-back circuit and the control and measurement module are coupled through the LNA, wherein:
the transmit block includes a pre-amplifier; and
the control and measurement module is configured to:
  set gain of the pre-amplifier independent of the PA by a determination of whether the distortion to the signal coupled from the output of the loop-back circuit is above an acceptable limit;
  if the distortion to the signal coupled from the output of the loop-back circuit is above the acceptable limit, provide a signal to the pre-amplifier to increase the gain provided by the pre-amplifier; and
  if the distortion to the signal coupled from the output of the loop-back circuit is below the acceptable limit, reduce the gain provided by the pre-amplifier.

59. The transceiver of claim 58, further comprising a receive block, wherein signals coupled between the LNA and the control and measurement module are coupled through the receive block.

60. The transceiver of claim 9, wherein:
the receive block includes a digital to analog converter (DAC);
the control and measurement module is configured to:
  control the gain of digital inputs to the DAC; and
  set the gain of the digital inputs to the DAC independent of the PA based on a determination of whether the distortion to the signal coupled from the output of the loop-back circuit is above an acceptable limit, wherein:
    if the distortion to the signal coupled from the output of the loop-back circuit is above the acceptable limit, gain of the digital inputs to the DAC is decreased; and
    if the distortion to the signal coupled from the output of the loop-back circuit is below the acceptable limit, gain of the digital inputs to the DAC is increased.

61. The transceiver of claim 58, wherein the output of the PA is coupled to an operational load.

62. The transceiver of claim 61, wherein the operational load is an active network.

63. The transceiver of claim 61, wherein the control and measurement module is configured to provide a test signal to the PA to be transmitted during times at which transmission of test signals will not interfere with operations of the network.

64. The transceiver of claim 61, wherein the control and measurement module is configured to: (i) receive information intended to be transmitted to a receiver over the network; (ii) modulate the information; and (iii) couple the modulated information to the PA.

65. The transceiver of claim 58, wherein the distortion measurement is made based on measurements of a peak amplitude of a loop-back signal.

66. The transceiver of claim 58, wherein the distortion measurement is made based on measurements of a peak to average ratio of a loop-back signal.

67. The transceiver of claim 58, wherein the distortion measurement is made based on amplitude compression in the peak amplitude of a loop-back signal.

68. The transceiver of claim 58, wherein the distortion measurement is made based on both phase compression and amplitude compression in the peak amplitude of a loop-back signal.

69. The transceiver of claim 68, wherein the signal to be transmitted is a test tone.

70. The transceiver of claim 69, wherein the test tone is an orthogonal frequency division multiplexed (OFDM) signal comprising a plurality of carriers upon which test data is modulated.

71. The transceiver of claim 68, wherein live transmit signals modulated with information intended for reception by a receiver.

72. The transceiver of claim 58, wherein the distortion measurement is made based on transmit modulation error rate (MER) for the loop-back signal.

73. A transceiver comprising:
a variable gain power amplifier (PA), the PA configured to receive a signal to be transmitted, and provide gain to the signal to be transmitted;
a loop-back circuit having a first terminal and a second terminal, the first terminal coupled to an output of the PA;
a control and measurement module that is:
  coupled to the PA and to an output of the loop-back circuit; and
  configured to:
    provide the signal to be transmitted to the PA;
    measure whether distortion to the signal coupled from the output of the loop-back circuit is above an acceptable limit;
    if the amount of distortion is below the acceptable limit, provide a signal to the PA to increase the gain provided by the PA; and
    if the amount of distortion is above the acceptable limit, reduce the gain provided by the PA;
a transmit block, wherein signals coupled from the control and monitor measurement module to an input of the PA are coupled through the transmit block;
a low noise amplifier (LNA) wherein signals coupled between the second terminal of the loop-back circuit and the control and measurement module are coupled through the LNA; and
a receive block, wherein signals coupled between the LNA and the control and measurement module are coupled through the receive block, wherein:

the receive block includes a digital to analog converter (DAC); and the control and measurement module is configured to:
   control the gain of digital inputs to the DAC; and
   set the gain of the digital inputs to the DAC independent of the PA based on a determination of whether the distortion to the signal coupled from the output of the loop-back circuit is above an acceptable limit, wherein:
      if the distortion to the signal coupled from the output of the loop-back circuit is above the acceptable limit, gain of the digital inputs to the DAC is decreased; and
      if the distortion to the signal coupled from the output of the loop-back circuit is below the acceptable limit, gain of the digital inputs to the DAC is increased.

74. The transceiver of claim 73, wherein the output of the PA is coupled to an operational load.

75. The transceiver of claim 74, wherein the operational load is an active network.

76. The transceiver of claim 74, wherein the control and measurement module is configured to provide a test signal to the PA to be transmitted during times at which transmission of test signals will not interfere with operations of the network.

77. The transceiver of claim 74, wherein the control and measurement module is configured to: (i) receive information intended to be transmitted to a receiver over the network; (ii) modulate the information; and (iii) couple the modulated information to the PA.

* * * * *